(12) United States Patent
Koike et al.

(10) Patent No.: US 7,978,503 B2
(45) Date of Patent: Jul. 12, 2011

(54) STATIC SEMICONDUCTOR MEMORY WITH A DUMMY CALL AND A WRITE ASSIST OPERATION

(75) Inventors: Tsuyoshi Koike, Kyoto (JP); Hidenari Kanehara, Kyoto (JP)

(73) Assignee: Panasonic Corporation, Osaka (JP)

( * ) Notice: Subject to any disclaimer, the term of this patent is extended or adjusted under 35 U.S.C. 154(b) by 478 days.

(21) Appl. No.: 11/730,977

(22) Filed: Apr. 5, 2007

(65) Prior Publication Data
US 2007/0263447 A1    Nov. 15, 2007

(30) Foreign Application Priority Data

May 9, 2006 (JP) .................................. 2006-129832
Feb. 8, 2007 (JP) .................................. 2007-028839

(51) Int. Cl.
*G11C 11/41* (2006.01)
*G11C 11/413* (2006.01)
*G11C 11/419* (2006.01)
*G11C 11/412* (2006.01)
*G11C 11/417* (2006.01)

(52) U.S. Cl. .................. 365/156; 365/154; 365/189.16; 365/202; 365/210.1; 365/210.11; 365/210.12; 365/210.13; 365/233.1; 365/233.16

(58) Field of Classification Search .................. 365/154, 365/202, 210.1, 210.11, 210.13, 189.16, 365/156, 210.12, 233.1, 233.16
See application file for complete search history.

(56) References Cited

U.S. PATENT DOCUMENTS

| 5,793,671 | A    | 8/1998  | Selcuk |
| 6,201,757 | B1 * | 3/2001  | Ward et al. ............... 365/230.05 |
| 6,316,812 | B1   | 11/2001 | Nagoaka |
| 6,363,005 | B1 * | 3/2002  | Wang et al. ................... 365/154 |
| 6,862,227 | B2   | 3/2005  | Yamaoka et al. |
| 6,977,834 | B2 * | 12/2005 | Onizawa et al. ................ 365/63 |
| 6,999,367 | B2 * | 2/2006  | Yamagami ................ 365/210.1 |

FOREIGN PATENT DOCUMENTS

JP    2002-42476 A    2/2002

OTHER PUBLICATIONS

M. Yamaoka et al., "Low-Power Embedded SRAM Modules with Expanded Margins for Writing", ISSCC Digest of Technical Papers, Feb. 9, 2005, pp. 480-481 & 611.

* cited by examiner

*Primary Examiner* — J. H. Hur
(74) *Attorney, Agent, or Firm* — McDermott Will & Emery LLP

(57) ABSTRACT

A dummy memory cell for detection of write completion timing is provided as a replica of a memory cell. When assisting a write operation by power supply control and substrate potential control of the memory cell, the timing of ending the write assist operation is determined by a voltage control circuit based on information about the dummy memory cell. For example, the voltage control circuit performs, in a data write operation in the memory cell, the write assist operation of decreasing the voltage of a source power supply allocated to P-channel MOS load transistors using a pull-down transistor. Thereafter, at the time when completion of the data write operation in the dummy memory cell is detected, the voltage control circuit ends the write assist operation and restores the voltage of the source power supply to the original level using a pull-up transistor.

5 Claims, 4 Drawing Sheets

STATIC SEMICONDUCTOR MEMORY WITH A DUMMY CALL AND A WRITE ASSIST OPERATION

BACKGROUND OF THE INVENTION

1. Field of the Invention

The present invention relates to a technique for achieving improved reliability, increased operation speed, and reduced power consumption of a static semiconductor memory.

2. Description of the Prior Art

The SRAM (static random access memory) of a CMOS (complementary metal oxide semiconductor) type having a large number of memory cells, each memory cell having a 6-transistor configuration, has been known. Each memory cell consists of a pair of P-channel MOS load transistors, a pair of N-channel MOS transfer transistors, and a pair of N-channel MOS drive transistors.

In recent years, decrease in supply voltage and shrinkage of the transistor size have been developing a tendency to decrease the drivability of each transistor of a memory cell, and accordingly, the write speed has been decreasing. As countermeasures to this problem, various techniques have been proposed for assisting the write operation of writing data in a memory cell. For example, such a write assisting technique has been known that, for the purpose of decreasing the voltage of a source power supply allocated to the pair of P-channel MOS load transistors of a memory cell only during a write cycle, the sources of the P-channel MOS load transistors are set floating (see M. Yamaoka et al., "Low-Power Embedded SRAM Modules with Expanded Margins for Writing," ISSCC Digest of Technical Papers, pp. 480-481, February, 2005).

However, in the conventional SRAM, how much the voltage of the source power supply allocated to load transistors, for example, is decreased for assisting a write operation, and the extent of a period of executing the write assist operation, are determined in advance by simulation in consideration of a certain margin such that the normal write operation is ensured even under the worst conditions. If this margin is too large, it is possible that extravagant power consumption is required because of a charged/discharged current which is necessary for restoring the voltage to the normal level, or that a superfluous increase in driver size is required for restoring the voltage to the normal level. In the case where the write assist operation affects the retention of a memory cell in which data is not to be written, such a large margin results in decrease of the reliability.

SUMMARY OF THE INVENTION

An objective of the present invention is to provide a technique for controlling the power supply and substrate potentials to ensure the reliability of a write operation in a static semiconductor memory.

To achieve the objective, according to the present invention, a dummy memory cell for detection of write completion timing is provided as a replica of a memory cell, and when assisting a write operation by power supply control and substrate potential control of the memory cell, the timing of ending the write assist operation is determined based on information about the dummy memory cell.

Specifically, according to the present invention, in a data write operation in a memory cell, at least one of the following write assist operations are performed: decreasing a voltage of a source power supply allocated to the P-channel MOS load transistors of both the memory cell and the dummy memory cell; increasing a voltage of a source power supply allocated to the N-channel MOS drive transistors of both the memory cell and the dummy memory cell; increasing a substrate potential of the P-channel MOS load transistors of both the memory cell and the dummy memory cell; increasing a substrate potential of the N-channel MOS transfer transistors of both the memory cell and the dummy memory cell; and decreasing a substrate potential of the N-channel MOS drive transistors of both the memory cell and the dummy memory cell, and thereafter, the write assist operation is ended at the time when completion of a data write operation in the dummy memory cell is detected.

When the operation of decreasing the voltage of the source power supply allocated to the P-channel MOS load transistors or the operation of increasing the substrate potential of the P-channel MOS load transistors is performed, the current flowing through the P-channel MOS load transistors of the memory cell decreases. Accordingly, the capacity of retaining the two memory nodes of the memory cell at the state before writing is decreased. As a result, the reliability of the write operation is improved.

When the operation of increasing the substrate potential of the N-channel MOS transfer transistors is performed, the current flowing through the N-channel MOS transfer transistors of the memory cell increases. Accordingly, the capacity of writing data in the two memory nodes of the memory cell is increased. As a result, the reliability of the write operation is improved.

When the operation of increasing the voltage of a source power supply allocated to the N-channel MOS drive transistors or the operation of decreasing the substrate potential of the N-channel MOS drive transistors is performed, the current flowing through the N-channel MOS drive transistors of the memory cell decreases. Accordingly, the capacity of retaining the two memory nodes of the memory cell at the state before writing is decreased. As a result, the reliability of the write operation is improved.

Furthermore, according to the present invention, the write assist operation is ended at the time when completion of a data write operation in the dummy memory cell is detected. Therefore, the minimum voltage adjustment margin which is necessary for assisting the write operation is obtained.

DESCRIPTION OF THE PREFERRED EMBODIMENTS

Hereinafter, embodiments of the present invention are described in detail with reference to FIG. 1 through FIG. 4.

Figure 1:
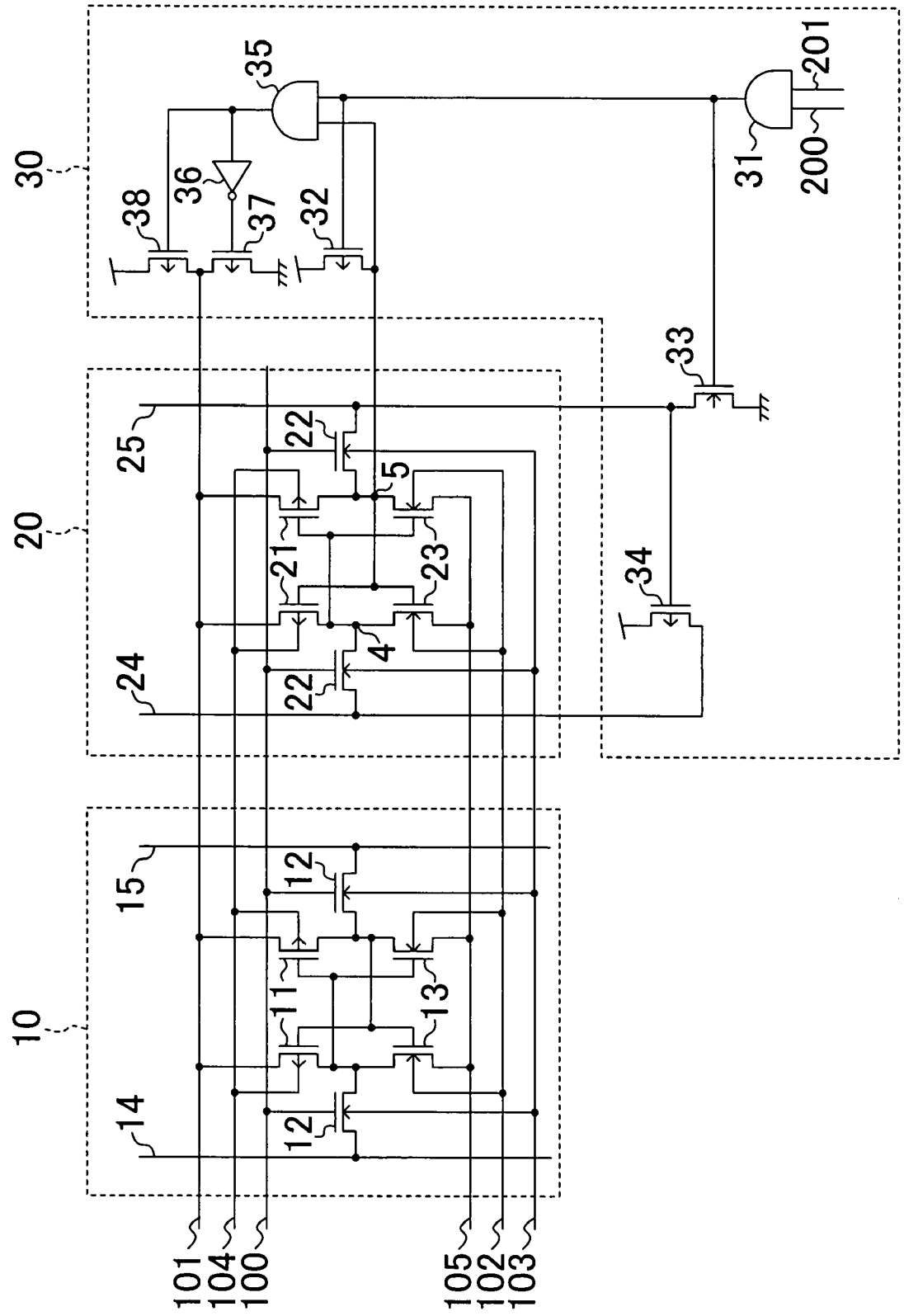
FIG. 1 is a circuit diagram showing an example of the structure of a static semiconductor memory according to the present invention.

FIG. 1 shows an example of the structure of a static semiconductor memory according to the present invention. As shown in FIG. 1, the static semiconductor memory includes a memory cell 10, a dummy memory cell 20, and a voltage control circuit 30.

The memory cell 10 is an SRAM memory cell which has a 6-transistor configuration, including a pair of P-channel MOS load transistors 11, a pair of N-channel MOS transfer transistors 12, and a pair of N-channel MOS drive transistors 13. The connection point of the drain of one of the P-channel MOS load transistors 11 and the drain of one of the N-channel MOS drive transistors 13 constitutes a first memory node, while the connection point of the drain of the other of the P-channel MOS load transistors 11 and the drain of the other of the N-channel MOS drive transistors 13 constitutes a second memory node. The first memory node is coupled to one of a pair of bit lines (bit line 14) via one of the N-channel MOS transfer transistors 12, while the second memory node is coupled to the other of the pair of bit lines (bit line 15) via the other of the N-channel MOS transfer transistors 12. The gate of each of the N-channel MOS transfer transistors 12 is connected to a word line 100. The source of each of the P-channel MOS load transistors 11 is connected to a source power supply 101 allocated to the P-channel MOS load transistors. The source of each of the N-channel MOS drive transistors 13 is connected to a source power supply 105 allocated to the N-channel MOS drive transistors. The back gate of each of the P-channel MOS load transistors 11 is connected to a P-channel MOS load transistor substrate potential 104. The back gate of each of the N-channel MOS transfer transistors 12 is connected to an N-channel MOS transfer transistor substrate potential 103. The back gate of each of the N-channel MOS drive transistors 13 is connected to an N-channel MOS drive transistor substrate potential 102. Arbitrary data can be written in the memory cell 10 by setting the word line 100 to H level while supplying arbitrary complementary data signals to the pair of bit lines 14 and 15 such that the N-channel MOS transfer transistors 12 become conductive (i.e., ON).

The dummy memory cell 20 is provided as a replica of the memory cell 10. The dummy memory cell 20 includes a pair of P-channel MOS load transistors 21, a pair of N-channel MOS transfer transistors 22, and a pair of N-channel MOS drive transistors 23 as does the memory cell 10. The connection point of the drain of one of the P-channel MOS load transistors 21 and the drain of one of the N-channel MOS drive transistors 23 constitutes a first memory node 4, while the connection point of the drain of the other of the P-channel MOS load transistors 21 and the drain of the other of the N-channel MOS drive transistors 23 constitutes a second memory node 5. The first memory node 4 is coupled to one of a pair of dummy bit lines (dummy bit line 24) via one of the N-channel MOS transfer transistors 22, while the second memory node 5 is coupled to the other of the pair of dummy bit lines (dummy bit line 25) via the other of the N-channel MOS transfer transistors 22. The gate of each of the N-channel MOS transfer transistors 22 is connected to the word line 100. The source of each of the P-channel MOS load transistors 21 is connected to the source power supply 101 allocated to the P-channel MOS load transistors. The source of each of the N-channel MOS drive transistors 23 is connected to the source power supply 105 allocated to the N-channel MOS drive transistors. The back gate of each of the P-channel MOS load transistors 21 is connected to the P-channel MOS load transistor substrate potential 104. The back gate of each of the N-channel MOS transfer transistors 22 is connected to the N-channel MOS transfer transistor substrate potential 103.

The back gate of each of the N-channel MOS drive transistors 23 is connected to the N-channel MOS drive transistor substrate potential 102.

The voltage control circuit 30 performs, in a data write operation in the memory cell 10, a write assist operation of decreasing the voltage of the source power supply 101 allocated to the P-channel MOS load transistors and then ends the write assist operation at the time when completion of a data write operation in the dummy memory cell 20 is detected. The voltage control circuit 30 includes a first AND gate 31, a P-channel MOS reset transistor 32, an N-channel MOS potential setting transistor 33, a P-channel MOS potential setting transistor 34, a second AND gate 35, an inverter circuit 36, a P-channel MOS pull-down transistor 37, and a P-channel MOS pull-up transistor 38.

The first AND gate 31 receives a clock signal 200 and an enable signal 201. The output of the first AND gate 31 is supplied to the gate of the P-channel MOS reset transistor 32, the gate of the N-channel MOS potential setting transistor 33, and the first input terminal of the second AND gate 35.

The P-channel MOS reset transistor 32 is rendered conductive (i.e., ON) before writing of data in the memory cell 10, i.e., during a period when the output of the first AND gate 31 is at L level, to reset the second memory node 5 of the dummy memory cell 20 to H level. Meanwhile, the first memory node 4 of the dummy memory cell 20 is automatically reset to L level.

The N-channel MOS potential setting transistor 33 becomes conductive at the time when a data write operation in the memory cell 10 is started, i.e., at the time when the output of the first AND gate 31 transitions from L level to H level, thereby setting the potential of the dummy bit line 25 to L level. The P-channel MOS potential setting transistor 34 becomes conductive at the time when the potential of the dummy bit line 25 is set to L level, thereby setting the potential of the dummy bit line 24 to H level. Namely, these potential setting transistors 33 and 34 supply predetermined dummy data which is to be written in the dummy memory cell 20 such that the reset potentials of the first and second memory nodes 4 and 5 are respectively inverted.

The second AND gate 35 receives the potential of the second memory node 5 of the dummy memory cell 20 at the second input terminal. The output of the second AND gate 35 is supplied to the input terminal of the inverter circuit 36 and to the gate of the P-channel MOS pull-up transistor 38. The inverter circuit 36 inverts the output of the second AND gate 35 and supplies the resultant inverse signal to the gate of the P-channel MOS pull-down transistor 37.

With the above-described structure, in the normal operation of the voltage control circuit 30, when the P-channel MOS pull-up transistor 38 becomes conductive so that the voltage of the source power supply 101 allocated to the P-channel MOS load transistors is maintained at a high level, a data write operation in the memory cell 10 is started. Accordingly, the output of the second AND gate 35 becomes H level, so that the P-channel MOS pull-down transistor 37 is rendered conductive, and the write assist operation of decreasing the voltage of the source power supply 101 allocated to the P-channel MOS load transistors is started. Thereafter, the data write operation in the dummy memory cell 20 is completed so that the potential of the second memory node 5 is transitioned to L level. Accordingly, the write assist operation is ended, and the P-channel MOS pull-up transistor 38 is rendered conductive again, whereby the source power supply 101 allocated to the P-channel MOS load transistors is restored to the original voltage.

As described above, according to the static semiconductor memory of FIG. 1, the dummy memory cell 20 for detection of the write completion timing is provided as a replica of the memory cell 10. Furthermore, in the case of performing the write assist operation of decreasing the voltage of the source power supply 101 allocated to the P-channel MOS load transistors, the timing of ending the write assist operation is determined based on the potential of the second memory node 5 of the dummy memory cell 20. Thus, the minimum voltage adjustment margin which is necessary for assisting the write operation is obtained. As a result, the stability of the write operation is improved, while lower power consumption and improved data retention characteristics are realized.

Figure 2:
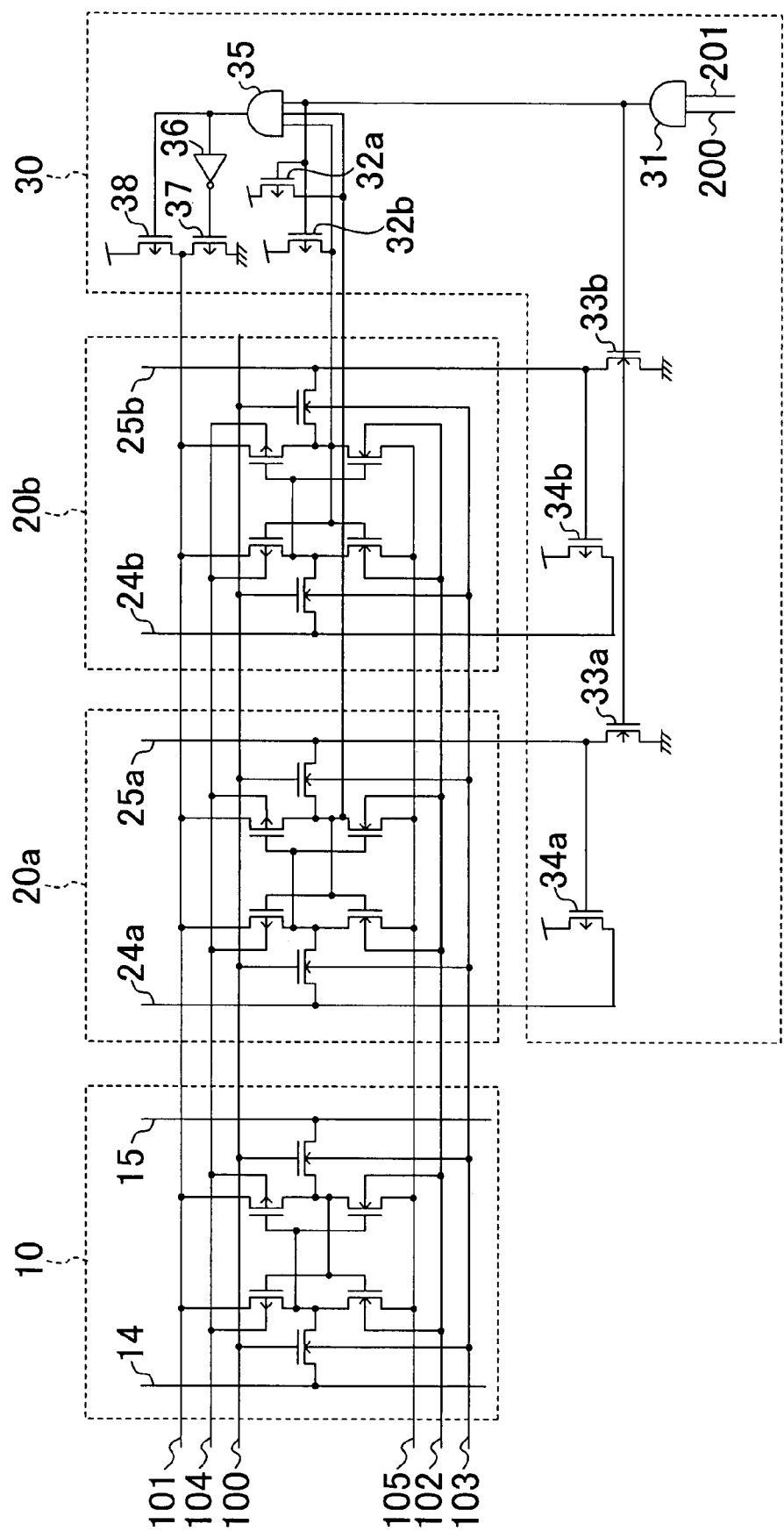
FIG. 2 is a circuit diagram showing another example of the structure of a static semiconductor memory according to the present invention.

FIG. 2 shows another example of the structure of a static semiconductor memory according to the present invention. In FIG. 2, a first dummy memory cell 20a and a second dummy memory cell 20b are each provided as a replica of the memory cell 10. The first dummy memory cell 20a includes a pair of dummy bit lines 24a and 25a. The second dummy memory cell 20b includes a pair of dummy bit lines 24b and 25b. The voltage control circuit 30 determines the timing of ending the write assist operation of decreasing the voltage of the source power supply 101 allocated to the P-channel MOS load transistors according to two signals indicative of completion of data write operations in the first and second dummy memory cells 20a and 20b. Specifically, the voltage control circuit 30 includes P-channel MOS reset transistors 32a and 32b, N-channel MOS potential setting transistors 33a and 33b, and P-channel MOS potential setting transistors 34a and 34b. The second AND gate 35 is a 3-input gate which receives the output of the first AND gate 31, the signal indicative of completion of a data write operation in the first dummy memory cell 20a, and the signal indicative of completion of a data write operation in the second dummy memory cell 20b.

In the static semiconductor memory of FIG. 2, the timing of ending the write assist operation is determined by the second AND gate 35 based on the logical product of the two signals indicative of completion of the data write operations in the first and second dummy memory cells 20a and 20b. Although the memory cell 10 and the first and second dummy memory cells 20a and 20b have different write characteristics, the timing of ending the write assist operation is determined according to the characteristics of one of the first and second dummy memory cells 20a and 20b in which the data write operation completes later. Therefore, the reliability of the write operation of the memory cell 10 improves.

It should be noted that the timing of ending the write assist operation may be determined based on the logical sum of the two signals indicative of completion of the data write operations in the first and second dummy memory cells 20a and 20b. Alternatively, three or more dummy memory cells may be provided as replicas of the memory cell 10. The number of dummy memory cells used may be dynamically changed.

Figure 3:
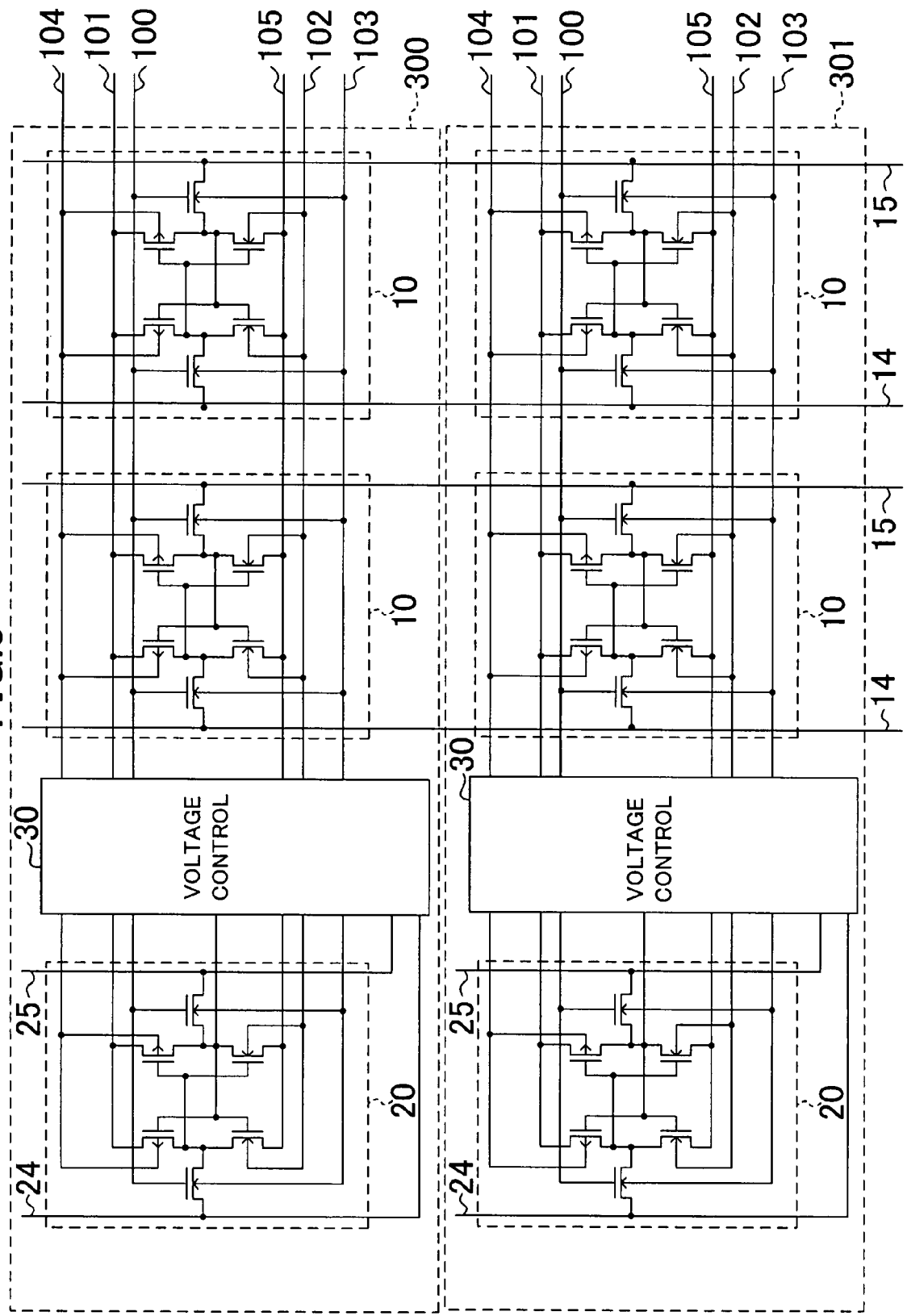
FIG. 3 is a circuit diagram showing still another example of the structure of a static semiconductor memory according to the present invention.

FIG. 3 shows still another example of the structure of a static semiconductor memory according to the present invention. In FIG. 3, a plurality of memory cells 10 which share a single word line 100 constitute a first word 300, and a plurality of other memory cells 10 which share another single word line 100 constitute a second word 301. The power supply system is separated between the first word 300 and the second word 301. Each word includes a dummy memory cell 20 and a voltage control circuit 30. The voltage control circuit 30 of each word utilizes the dummy memory cell 20 to perform the same write assist operation in every one of the plurality of memory cells 10. Herein, the write assist operation includes at least one of the following operations: decreasing the voltage of the source power supply 101 allocated to the P-channel MOS load transistors; increasing the voltage of the source power supply 105 allocated to the N-channel MOS drive transistors; increasing the P-channel MOS load transistor substrate potential 104; increasing the N-channel MOS transfer transistor substrate potential 103; and decreasing the N-channel MOS drive transistor substrate potential 102. In the data write operation in the memory cell 10, the voltage control circuit 30 ends the write assist operation at the time when completion of the data write operation in the dummy memory cell 20 is detected.

In FIG. 3, each word includes an independent voltage control circuit 30. Therefore, the write assist operation does not adversely affect the retention of the memory cells 10 of words in which data is not to be written (unselected words). It should be noted that each word may include a plurality of dummy memory cells.

Figure 4:
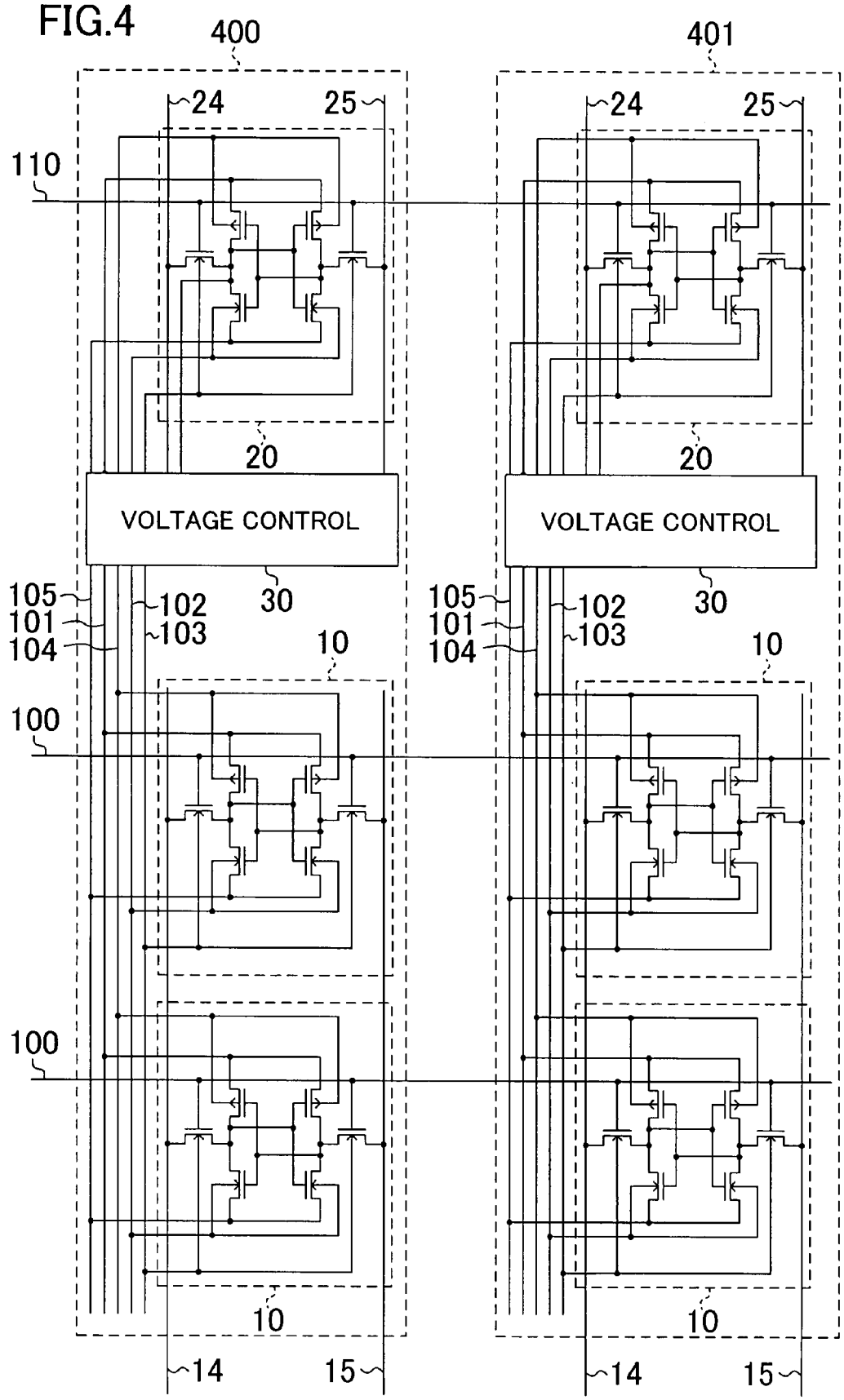
FIG. 4 is a circuit diagram showing still another example of the structure of a static semiconductor memory according to the present invention.

FIG. 4 shows still another example of the structure of a static semiconductor memory according to the present invention. In FIG. 4, a plurality of memory cells 10 which share a pair of bit lines 14 and 15 constitute a first bit 400, and a plurality of other memory cells 10 which share another pair of bit lines 14 and 15 constitute a second bit 401. The power supply system is separated between the first bit 400 and the second bit 401. Each bit includes a dummy memory cell 20 and a voltage control circuit 30. Line 110 is a dummy word line. The voltage control circuit 30 of each bit performs the same write assist operation in every one of the plurality of memory cells 10 and ends the write assist operation at the time when completion of the data write operation in the dummy memory cell 20 is detected.

In FIG. 4, each bit includes an independent voltage control circuit 30. Therefore, the write assist operation does not adversely affect the retention of the memory cells 10 of bits in which data is not to be written (unselected bits). It should be noted that each bit may include a plurality of dummy memory cells. Each block consisting of a plurality of bits may have one voltage control circuit 30 and one or more dummy memory cells.

Although the embodiments of the present invention have been described hereinabove with reference to FIG. 1 through FIG. 4, various modifications are possible. For example, the first and second memory nodes 4 and 5 of the dummy memory cell 20 may be reset by separately controlling the source power supplies of the pair of N-channel MOS drive transistors 23 of the dummy memory cell 20 of FIG. 1. Prior to a selection signal supplied to the gates of the N-channel MOS transfer transistors 12 of the memory cell 10, a dummy selection signal may be supplied to the gates of the N-channel MOS transfer transistors 22 of the dummy memory cell 20. Completion of the data write operation in the dummy memory cell 20 may be detected based on a current flowing inside the dummy memory cell 20.

In the dummy memory cell 20, the operation timing of the voltage control circuit 30 may be adjusted by adjusting any of the source power supply for the P-channel MOS load transistors 21, the source power supply for the N-channel MOS drive transistors 23, the threshold value of the P-channel MOS load transistors 21, the threshold value of the N-channel MOS transfer transistors 22, and the threshold value of the N-channel MOS drive transistors 23.

The timings of starting and ending the write assist operation in the voltage control circuit 30 may be adjusted according to an external signal. The write assist operation by the voltage control circuit 30 may be prohibited according to an external signal.

As described above, the static semiconductor memory of the present invention includes a dummy memory cell for detection of write completion timing as a replica of a memory cell, wherein the timing of ending a write assist operation for the memory cell is determined based on information about the dummy memory cell. Thus, the stability of the write operation is improved, while lower power consumption and improved data retention characteristics are realized. Therefore, the static semiconductor memory of the present invention is useful as a so-called SRAM, or the like.

What is claimed is:

1. A static semiconductor memory, comprising:
a memory cell including a pair of P-channel MOS load transistors, a pair of N-channel MOS transfer transistors, and a pair of N-channel MOS drive transistors;
a dummy memory cell including a pair of P-channel MOS load transistors, a pair of N-channel MOS transfer transistors, and a pair of N-channel MOS drive transistors; and
voltage control circuits selected from the group of the following voltage control circuits consisting of:
a voltage control circuit for decreasing a voltage of a source power supply allocated to the P-channel MOS load transistors of both the memory cell and the dummy memory cell,
a voltage control circuit for increasing a voltage of a source power supply allocated to the N-channel MOS drive transistors of both the memory cell and the dummy memory cell,
a voltage control circuit for increasing a substrate potential of the P-channel MOS load transistors of both the memory cell and the dummy memory cell,
a voltage control circuit for increasing a substrate potential of the N-channel MOS transfer transistors of both the memory cell and the dummy memory cell, and
a voltage control circuit for decreasing a substrate potential of the N-channel MOS drive transistors of both the memory cell and the dummy memory cell, wherein:
in a data write operation for the memory cell,
the voltage increasing or decreasing operation starts as a write assist operation,
a data write operation for the dummy memory cell starts by supplying a dummy selection signal to gates of the pair of N-channel MOS transfer transistors of the dummy memory cell before supplying a selection signal to gates of the pair of N-channel MOS transfer transistors of the memory cell, and
the voltage increasing or decreasing operation as a write assist operation ends after completion of the data write operation for the dummy memory cell is detected.

2. The static semiconductor memory of claim 1, further comprising another dummy memory cell which includes a pair of P-channel MOS load transistors, a pair of N-channel MOS transfer transistors, and a pair of N-channel MOS drive transistors,
wherein the voltage increasing or decreasing operation ends based on a result of a logical operation of values of memory nodes of the dummy memory cells.

3. The static semiconductor memory of claim 1, further comprising another memory cell which includes a pair of P-channel MOS load transistors, a pair of N-channel MOS transfer transistors, and a pair of N-channel MOS drive transistors and which shares one word line with the memory cell,
wherein the dummy memory cell is utilized to perform a same voltage increasing or decreasing operation in each of the memory cells.

4. The static semiconductor memory of claim 1, further comprising another memory cell which includes a pair of P-channel MOS load transistors, a pair of N-channel MOS transfer transistors, and a pair of N-channel MOS drive transistors and which shares a pair of bit lines with the memory cell,
wherein the dummy memory cell is utilized to perform a same voltage increasing or decreasing operation in each of the memory cells.

5. The static semiconductor memory of claim 1, further comprising any one of:
a voltage increasing transistor which has a gate coupled to a first control signal, a source coupled to a first power supply, and a drain coupled to sources allocated to the N-channel MOS drive transistors of both the memory cell and the dummy memory cell, and
a voltage decreasing transistor which has a gate coupled to a second control signal, a source coupled to a second power supply, and a drain coupled to sources allocated to the P-channel MOS load transistors of both the memory cell and the dummy memory cell,
wherein the first control signal and the second control signal are controlled according to a value of the memory node of the dummy memory cell.

* * * * *